US012633882B2

(12) United States Patent
Wenske

(10) Patent No.: US 12,633,882 B2
(45) Date of Patent: May 19, 2026

(54) AMPLIFIER WITH OVERVOLTAGE PROTECTION

(71) Applicant: Texas Instruments Incorporated, Dallas, TX (US)

(72) Inventor: Jordan Herschell Wenske, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1024 days.

(21) Appl. No.: 17/829,344

(22) Filed: May 31, 2022

(65) Prior Publication Data

US 2023/0091219 A1 Mar. 23, 2023

Related U.S. Application Data

(60) Provisional application No. 63/247,343, filed on Sep. 23, 2021.

(51) Int. Cl.
*H03F 1/52* (2006.01)
*H02H 3/20* (2006.01)
(52) U.S. Cl.
CPC .............. *H03F 1/523* (2013.01); *H02H 3/20* (2013.01); *H03F 2200/441* (2013.01)
(58) Field of Classification Search
None
See application file for complete search history.

(56) References Cited

U.S. PATENT DOCUMENTS 5,341,333 A * 8/1994 Tien ........................ G11C 7/062
327/51
5,850,139 A * 12/1998 Edwards ................. G05F 1/575
323/280

FOREIGN PATENT DOCUMENTS

CN 101364797 A * 2/2009

* cited by examiner

*Primary Examiner* — Andrea Lindgren Baltzell
*Assistant Examiner* — Malane Lieng
(74) *Attorney, Agent, or Firm* — Michelle F. Murray; Frank D. Cimino

(57) ABSTRACT

In described examples, a circuit includes a reference voltage, a driving circuit with a driving input and a driving output, an output transistor, and a clamp circuit with a clamp input and a clamp output. The output transistor includes a source, a drain, and a gate; the source is coupled to receive the reference voltage. The clamp input is coupled to the driving output and to the gate. The clamp output is coupled to either the driving input or to the driving output, the gate, and the clamp input. The clamp circuit is configured to detect an operating region of the output transistor and to generate a clamping current after the output transistor enters a triode region. The clamping current is selected to prevent an absolute value of a source-gate voltage of the output transistor from equaling or exceeding a gate oxide tunneling voltage of the output transistor.

20 Claims, 5 Drawing Sheets

AMPLIFIER WITH OVERVOLTAGE PROTECTION

CROSS-REFERENCE

This application is a non-provisional of, and claims priority to, U.S. Provisional Patent Application No. 63/247,343, filed Sep. 23, 2021, which is incorporated herein by reference.

TECHNICAL FIELD

This application relates generally to amplifiers, and more particularly to an amplifier with overvoltage protection.

BACKGROUND

Metal oxide semiconductor field effect transistors (MOSFETs) become conductive (are activated, or turned on) when a voltage greater than a threshold voltage is applied between the MOSFET's gate and its source. However, in some examples, such as in relatively small MOSFET devices with relatively thin gate oxides, a sufficiently high gate-source (or source-gate, depending on channel type) voltage can induce a strong enough electric field to cause the gate oxide to conduct, which can cause permanent damage to the MOSFET. This is referred to as gate oxide tunneling. This is a form of MOSFET breakdown distinct from avalanche multiplication, which is caused by a MOSFET's drain-source (or source-drain, depending on channel type) voltage exceeding a maximum value.

Amplifiers can use MOSFETs, for example, to determine amplifier gain and to control amplifier output. In some examples, MOSFETs used by an amplifier have a breakdown voltage lower than a voltage difference between a relatively high voltage rail (such as an output of the amplifier's power source) and a relatively low voltage rail (such as ground).

SUMMARY

In described examples, a circuit includes a reference voltage, a driving circuit with a driving input and a driving output, an output transistor, and a clamp circuit with a clamp input and a clamp output. The output transistor includes a source, a drain, and a gate; the source is coupled to receive the reference voltage. The clamp input is coupled to the driving output and to the gate. The clamp output is coupled to either the driving input or to the driving output, the gate, and the clamp input. The clamp circuit is configured to detect an operating region of the output transistor and to generate a clamping current after the output transistor enters a triode region. The clamping current is selected to prevent an absolute value of a source-gate voltage of the output transistor from equaling or exceeding a gate oxide tunneling voltage of the output transistor.

DETAILED DESCRIPTION

In some examples, an amplifier 100 (FIG. 1) receives a control signal $V_{IN}$ that corresponds to an ideal (target) output voltage of the amplifier $V_{OUT\_IDEAL}$, while in fact the amplifier output provides an actual output voltage $V_{OUT}$. The amplifier uses a feedback voltage $V_{FB}$ dependent on $V_{OUT}$ to self-regulate, and uses an output control MOSFET (MPout 136) to control $V_{OUT}$. In some examples, a gate of MPout 136 has an excessive voltage limit $V_{EVL}$ that is less than a maximum available voltage that can be applied to that gate, the maximum set by a (relatively) high reference voltage $V_{DD}$ of the amplifier 100 minus a threshold voltage $V_T$ of (in the amplifier 100 of FIG. 1) MPshift 148. Herein, $V_{EVL}$, is used to refer to a MOSFET's excessive voltage limit, which is a source-gate or gate-source voltage (depending on whether the MOSFET is a p-channel or n-channel type MOSFET) above which gate oxide tunneling will occur. $V_{BREAKDOWN}$ is used to refer to a source-drain voltage above which avalanche multiplication will occur (in p-channel MOSFETS; drain-source voltage in n-channel MOSFETS). If the control signal $V_{IN}$ specifies a $V_{OUT\_IDEAL}$ greater than $V_{DD}$, the regulation feedback loop of the amplifier 100 causes a driver MOSFET (for example, MPshift 148 in FIG. 1, and various MOSFETs of an amplifier stage 129 acting together in FIG. 5) that controls the bias voltage of MPout 136 to try to increase the source-gate voltage $V_{SG}$ of MPout 136 not only past a source-gate voltage at which MPout 136 is fully turned on, but also past $V_{EVL}$.

To protect the amplifier 100 against this potentially destructive feedback loop result, it includes a clamp circuit 162 that senses the possibility of overdriving the MPout 136 gate, where the condition detected is the operating region of MPout 136. In particular, when MPout 136 is in its saturation region, $V_{SG}-V_T<V_{SD}$, and the limit of $V_{SD}$ to the system highest voltage level ($V_{DD}$) acts as an upper bound to $V_{SG}$. In contrast, when MPout 136 is in the triode region (also called the linear region), so that $V_{SG}>V_T$ and $V_{SG}-V_T>V_{SD}$ (where $V_{SD}$ is the source-drain voltage), then $V_{SG}$ can be driven greater than $V_{SD}$ and to destructive levels. The clamp circuit 162 operates to detect that MPout 136 is in the triode region and imparts a safety control response that limits $V_{SG}$ below an excessive level. MPout 136 reaches full conductivity (minimum resistance) in the triode region. The clamp circuit 162 generates a clamping current $I_{CLAMP}$, which modifies the bias voltage of MPshift 148 to limit increases in the source-gate voltage of MPout 136 beyond $V_{SG}=V_{SD}+V_T$ This prevents MPshift 148 from increasing the source-gate voltage of MPout 136 to $V_{EVL}$.

Figure 1:
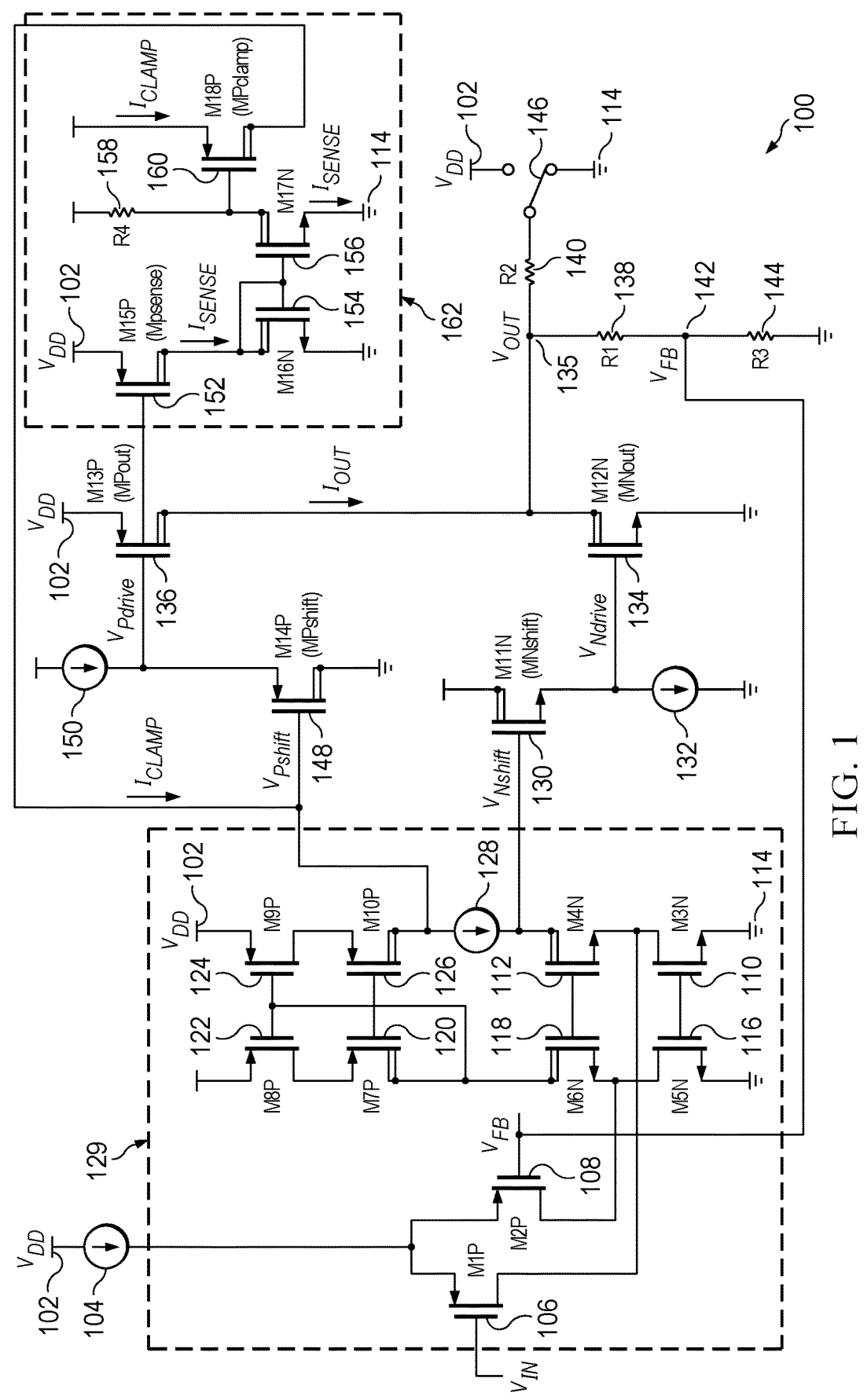
FIG. 1 shows a circuit diagram of an example amplifier.

FIG. 1 shows a circuit diagram of an example amplifier 100. A (relatively) high voltage reference 102, providing a reference voltage $V_{DD}$, is connected to an input terminal of a first current source 104. (MOSFETs will be numbered as M[number][channel type], where the number increases regardless of channel type.) An output terminal of the first current source 104 is connected to a source of a first p-channel MOSFET M1P 106, and to a source of a second p-channel MOSFET M2P 108. Together, M1P 106 and M2P 108 form a differential pair input. A gate of M1P 106 is connected to receive the control voltage $V_{IN}$. A drain of M1P 106 is connected to a drain of a third n-channel MOSFET M3N 110, and to a source of a fourth, drain-extended n-channel MOSFET M4N 112. In some examples, extending the drain of a MOSFET increases the breakdown voltage of the MOSFET. A drain-extended MOSFET can be implemented as an n-channel device or a p-channel device. In the figures, MOSFETs drawn with two parallel lines representing the drain are drain-extended MOSFETs. A source of M3N 110 is connected to ground 114. In some examples, ground 114 is a (relatively) low voltage reference other than a ground.

A gate of M2P 108 is connected to a feedback voltage node 142 to receive the feedback voltage $V_{FB}$. A drain of M2P 108 is connected to a drain of a fifth n-channel MOSFET M5N 116, and to a source of a sixth, drain-extended n-channel MOSFET M6N 118. A gate of M3N 110 is connected to a gate of M5N 116. A gate of M4N 112 is connected to a gate of M6N 118.

A drain of M6N 118 is connected to a drain of a seventh, drain-extended p-channel MOSFET M7P 120, to a gate of an eighth p-channel MOSFET M8P 122, and to a gate of a ninth p-channel MOSFET M9P 124. A source of M7P 120 is connected to a drain of M8P 122. A source of M8P 122 and a source of M9P 124 are connected to the high voltage reference 102. A gate of M7P 120 is connected to a gate of a tenth, drain-extended p-channel MOSFET M10P 126. A drain of M9P 124 is connected to a source of M10P 126. Together, M1P 106, M2P 108, M3N 110, M4N 112, M5N 116, M6N 118, M7P 120, M8P 122, M9P 124, M10P 126, and a second current source 128, connected from the drain of M10P 126 to the drain of M4N 112, comprise the amplifier stage 129 of the amplifier 100. (The amplifier stage 129 uses a folded cascode amplifier topology.) One or more arrangements of current sources driving respective diode-connected devices (not shown) are used to establish bias voltages for each of the following connected pairs of MOSFETs: M3N 110 and M5N 116, M4N 112 and M6N 118, and M7P 120 and M10P 126. The amplifier stage 129 generates a voltage to adjust an n-channel transistor gate bias, $V_{Nshift}$, responsive to a difference between $V_{IN}$ and $V_{FB}$.

A drain of M4N 112 is connected to a gate of an eleventh n-channel drain-extended MOSFET M11N 130. M11N 130 is referred to as MNshift 130, because it shifts $V_{Ndrive}$ to equal $V_{Nshift}$ minus the threshold voltage of MNshift 130. Also, MNshift 130 is configured as a source follower. A voltage at the gate of MNshift 130 is referred to as $V_{Nshift}$. A drain of MNshift 130 is connected to the high voltage reference 102. A source of MNshift 130 is connected to an input terminal of a third current source 132, and to a gate of a twelfth, drain-extended n-channel MOSFET M12N 134. The third current source 132 outputs a fixed current, which corresponds to MNshift 130 remaining on with an approximately constant source-gate voltage. (Herein, approximately or approximately the same means equal to or the same within design specifications and manufacturing tolerances.)

The voltage at the source of MNshift 130 is referred to as $V_{Ndrive}$, because it drives (biases) the gate of the n-channel transistor M12N 134. M12N 134 can act as an open circuit, a voltage-controlled current amplifier, a resistive element with variable resistance, or as a short, depending on the $V_{Ndrive}$ voltage at the gate of MNout 134. Open circuit behavior generally corresponds to the cutoff region, voltage-controlled current amplification corresponds to the saturation region, and resistive and short behavior correspond to the triode region (also called the linear region). Accordingly, M12N 134 is also referred to as MNout 134, because MNout 134 controls a voltage $V_{OUT}$ at an output terminal 135 of the amplifier 100 by connecting or disconnecting the output terminal 135 to ground 114, depending on an activation state of MNout 134.

An output terminal of the third current source 132 is connected to ground 114. A source of MNout 134 is connected to ground 114. A drain of MNout 134 is connected to a drain of a thirteenth, drain-extended p-channel MOSFET M13P 136, a first terminal of a first resistor R1 138, and a first terminal of a second resistor R2 140.

M13P 136 is also referred to as MPout 136, because MPout 136 controls $V_{OUT}$ by connecting the output terminal 135 to, or disconnecting the output terminal 135 from, the high voltage reference 102, depending on an activation state of MPout 136. MPout 136 can act as an open circuit, a voltage-controlled current amplifier, a resistive element with variable resistance, or as a short—respectively corresponding to cutoff, saturation, and triode regions, as described above—depending on a voltage $V_{Pdrive}$ at the gate of MPout 136.

A second terminal of R1 138 is connected to the feedback voltage node 142, which has the feedback voltage $V_{FB}$. The feedback voltage node 142 is connected to a first terminal of a third resistor R3 144. A second terminal of R3 144 is connected to ground 114. A second terminal of R2 140 is connected to a pole of a switch 146. A first throw terminal of the switch 146 is connected to the high voltage reference 102, and a second throw terminal of the switch 146 is connected to ground 114. In FIG. 1, the switch 146 is shown coupling $V_{OUT}$ 135 to ground 114, so that $V_{OUT}$ 135 is primarily responsive to current through MPout 136. Together, R1 138 and R3 144 form a resistor divider, so that $V_{FB}$ is given by Equation 1:

$$V_{FB} = \frac{R3}{R1 + R3} \times V_{OUT} \qquad \text{Equation 1}$$

A gate of MPout 136 is connected to a source of a fourteenth, drain-extended p-channel MOSFET M14P 148, an output terminal of a fourth current source 150, and a gate of a fifteenth, drain-extended p-channel MOSFET M15P 152. The fourth current source 150 outputs a fixed current, which corresponds to MPshift 148 remaining on with an approximately constant source-gate voltage equal to the threshold voltage of MPshift 148.

M15P 152 is referred to as MPsense 152, because it is used to generate a current $I_{SENSE}$ used to sense the region in which MPout 136 is operating—accordingly, whether MPout 136 is operating in saturation region or triode region. MPout 136 and MPsense 152 are matched devices, meaning they have source-drain currents that are approximately proportional in response to receiving the same bias voltages while operating in the same region—for example, while both are operating in the saturation region. Accordingly, while MPout 136 and MPsense 152 are operating in the same region, $I_{SENSE}=a \times I_{OUT}$, where a is a scalar and $I_{OUT}$ is a source-drain current of MPout 136. M14P 148 is referred to as MPshift 148, because it shifts $V_{Pdrive}$ to equal $V_{Pshift}$ minus the threshold voltage of MPshift 148. Also, MPshift 148 is configured as a source follower. The voltage at the source of MPshift 148 is referred to as $V_{Pdrive}$, because it drives the gate of the p-channel transistor (biases) MPout 136. The voltage at the gate of MPshift 148 is referred to as $V_{Pshift}$. An input terminal of the fourth current source 150 is connected to the high voltage reference 102. A drain of MPshift 148 is connected to ground 114. A gate of MPshift 148 is connected to a drain of M10P 126, an input terminal of the second current source 128, and a drain of an eighteenth, drain-extended p-channel MOSFET M18P 160.

M18P 160 is referred to as MPclamp 160 because it is used to generate $I_{CLAMP}$. The amplifier stage 129 generates a voltage to adjust a p-channel transistor gate bias, $V_{Pshift}$, responsive to a difference between $V_{IN}$ and $V_{FB}$.

A source of MPsense 152 is connected to the high voltage reference 102. A drain of MPsense 152 is connected to a drain and a gate of a sixteenth, drain-extended n-channel MOSFET M16N 154, and to a gate of a seventeenth, drain-extended n-channel MOSFET M17N 156. Together, M16N 154 and M17N 156 act as a current mirror. A source of M16N 154 is connected to ground 114. A source of M17N 156 is connected to ground 114. A drain of M17N 156 is connected to a first terminal of a fourth resistor R4 158, and to a gate of MPclamp 160. A second terminal of R4 158 and a source of MPclamp 160 are connected to the high voltage reference 102. Together, MPsense 152, M16N 154, M17N 156, R4 158, and MPclamp 160 are referred to as a clamp circuit 162.

The amplifier 100 is configured to output the voltage $V_{OUT}$ dependent on the control voltage $V_{IN}$ and the feedback loop moderated by the resistor-divider formed by R1 138 and R3 144. This relationship is described by Equation 2:

$$V_{OUT} = \left(1 + \frac{R1}{R3}\right) \times V_{IN} \qquad \text{Equation 2}$$

Accordingly, the amplifier 100 is configured to generate an output voltage $V_{OUT}$ with a fixed closed-loop gain with respect to the control voltage $V_{IN}$. Also, $V_{OUT}$ is limited by the voltage reference $V_{DD}$, corresponding to MPout 136 being fully turned on. For MPout 136, $V_{SG} = V_{DD} - V_{Pdrive}$. As $V_{IN}$ increases, $V_{Pshift}$ decreases, which decreases $V_{Pdrive}$, which increases $V_{SG}$ of MPout 136. While MPout 136 remains in the saturation region, increasing $V_{SG}$ results in a relatively large increase in $I_{OUT}$ and $V_{OUT}$, and a corresponding relatively large decrease in the source-drain voltage $V_{SD}$ of MPout 136. While MPout 136 is in the triode region, increasing $V_{SG}$ results in a relatively much smaller increase in $I_{OUT}$ and $V_{OUT}$, and a corresponding relatively much smaller decrease in the source-drain voltage $V_{SD}$ of MPout 136; $V_{OUT} = V_{DD} - V_{SD}$. Accordingly, $V_{Pshift}$ decreasing corresponds to the feedback loop of the amplifier 100 trying to make MPout 136 more conductive to increase $V_{OUT}$. A level of $V_{Pdrive}$ that will cause MPout 136 to enter the triode region is referred to herein as $V_{TRIODE}$.

Amplifier 100 behavior will initially be considered without the clamp circuit 162 and the clamping current $I_{CLAMP}$. When MPout 136 is fully activated (in the triode region), $V_{OUT} \approx V_{DD}$ and the corresponding control voltage is described by Equation 3:

$$V_{IN} \approx \frac{V_{DD}}{1 + R1/R3} \qquad \text{Equation 3}$$

If $V_{IN}$ increases above the level described by Equation 3 (determined by $V_{DD}$, R1, and R3), $V_{FB}$ stops increasing because $V_{FB}$ is proportional to $V_{OUT}$ (as described in Equation 1), and $V_{OUT}$ is limited to $V_{DD}$. This causes $V_{Pshift}$ and $V_{Pdrive}$ to decrease to try to make MPout 136 more conductive in an attempt to make $V_{FB}$ equal $V_{IN}$, even after MPout 136 is fully activated. However, the inequality between $V_{IN}$ and $V_{FB}$ remains unresolved. Accordingly, $V_{Pdrive}$ to MPout 136 decreases until $V_{SG} > V_{EVL}$, which may result in gate oxide damage to MPout 136.

In some examples, this situation can occur during power supply fluctuations or other nominal circuit behavior excursions, such as when $V_{DD}$ is lower than nominal, designed $V_{DD}$, or $V_{IN}$ exceeds the designed range for $V_{IN}$. For example, nominally, $V_{IN}$ is between zero and two volts, $V_{DD}$ is four volts, and $1 + R1/R3 = 2$. If, during amplifier 100 operation, $V_{IN}$ equals 2.1 volts and $V_{DD}$ equals 3.8 volts, then $V_{OUT\_IDEAL}$ equals 4.2 volts. Because $V_{OUT\_IDEAL}$ of 4.2 volts is greater than the achievable $V_{OUT}$ of 3.8 volts, $V_{SG}$ of MPout 136 will exceed $V_{EVL}$ as the amplifier 100 attempts to pull the output voltage above the supply voltage.

Amplifier 100 behavior is now described including the clamp circuit 162 and the clamping current $I_{CLAMP}$. As described above, MPsense 152 is matched to MPout 136. This enables the clamp circuit 162 to sense an operating region of MPout 136; specifically, it enables the clamp circuit 162 to sense when MPout 136 operates in the triode region. MPout 136 enters the triode region when $V_{SG} > V_T$ and $V_{SG} - V_T > V_{SD}$. As described above, MPsense 152 has a source-drain current $I_{SENSE}$, which is mirrored by the current mirror (M16N 154 and M17N 156), so that M17N 156 also has a source-drain current $I_{SENSE}$. MPclamp 160 has a source-drain current $I_{CLAMP}$ that is generated in response to the bias voltage of MPclamp 160, which equals $V_{DD} - I_{SENSE} \times R4$.

$V_{Pdrive}$ drives MPout 136 and MPsense 152, and the voltage $V_{DD} - I_{SENSE} \times R4$ drives MPclamp 160. Various relevant properties of the components of the clamp circuit 162, such as current responses affecting the scalar relationship between $I_{OUT}$ and $I_{SENSE}$, the resistance of R4 158, and the threshold voltage of MPclamp 160, are selected so that MPclamp 160 activates to conduct after MPout 136 enters the triode region, and sufficiently prior to $V_{Pdrive}$ reaching $V_{EVL}$ for $I_{CLAMP}$ to be able to clamp $V_{Pshift}$ and $V_{Pdrive}$ to prevent $V_{SG}$ from reaching $V_{EVL}$. These properties are selected in response to manufacturing variability, to prevent the $V_{SG}$ of MPclamp 160 from reaching its threshold voltage before $V_{Pdrive}$ reaches $V_{TRIODE}$, and to prevent the $V_{SG}$ of MPclamp 160 from reaching its threshold voltage too late for $I_{CLAMP}$ to be able to clamp $V_{Pshift}$ and $V_{Pdrive}$ to prevent $V_{SG}$ from reaching $V_{EVL}$. This avoids activating MPclamp 160 and clamping $V_{Pshift}$ and $V_{Pdrive}$ while MPout 136 remains in the saturation region, which could affect normal operation of the amplifier 100, and also prevents MPout 136 from experiencing gate oxide tunneling. Because MPclamp 160 is off when $V_{Pdrive}$ is greater than $V_{TRIODE}$, $I_{CLAMP}$ is a trickle current (small enough not to impact operation of the amplifier stage 129, or zero) when MPout 136 is not in the triode region (when MPout 136 is in the saturation region or the cutoff region).

Though MPout 136 enters the triode region when $V_{Pdrive} = V_{TRIODE}$, MPsense 152 does not also enter the triode region, but instead remains in the saturation region due to M16N 154. M16N 154 is diode connected, meaning that its gate and drain are shorted, thereby maintaining a relatively high source-drain voltage across MPsense 152 by imposing a threshold voltage drop between its drain and ground. This causes M16N 154 to be in the saturation region for most currents. Also, an effective resistance of M16N 154 decreases as $V_{Pdrive}$ decreases and $I_{SENSE}$ increases, because M16N 154 becomes increasingly conductive as $I_{SENSE}$ increases. As M16N 154 becomes increasingly conductive, the node between the drains of MPsense 152 and M16N 154 becomes more closely coupled to ground 114, so that the drain voltage of MPsense 152 remains approximately constant or increases negligibly. This means that as the source-gate voltage of MPsense 152 increases, a decrease in the source-drain voltage of MPsense 152 is limited, so that for MPsense 152, $V_{SG}-V_T \leq V_{SD}$ and MPsense 152 remains in the saturation region. Accordingly, and as detailed later, the characteristic response at a same source-gate voltage for the matched transistors, MPout 136 and MPsense 152, differs when MPout 136 and MPsense 152 operate in different operational regions. This differentiated response facilitates using MPsense 152 to activate MPclamp 160 so that $I_{CLAMP}$ can be generated to prevent a runaway overdriving of MPout 136 when MPout 136 is operated in the triode region.

MPsense 152 remaining in the saturation region enables power savings in the clamp circuit 152 and reduces effects of leakage current on amplifier 100 operation. Also, close matching between MPout 136 and MPsense 152 enables the clamp circuit 162 to self-compensate for manufacturing variations, to some extent. For a p-channel type MOSFET in the triode region (as noted above, also called the linear region), source-drain current is linearly proportional to source-gate voltage, and is relatively strongly dependent on source-drain voltage, as shown in Equation 4:

$$I_{SD} = \mu_p C_{OX} \frac{W}{L} \left[ (V_{SG} - |V_T|) V_{SD} - V_{SD}^2/2 \right] \qquad \text{Equation 4}$$

In Equation 4 (and Equation 5, below), $\mu_p$ is the charge-carrier effective mobility, $C_{OX}$ is the gate oxide capacitance per unit area, L and W are the length and width of the gate, and $\lambda$, is the channel-length modulation parameter. For a p-channel type MOSFET in the saturation region, source-drain current is proportional to the square of source-gate voltage, and is relatively weakly dependent on source-drain voltage, as shown in Equation 4:

$$I_{SD} = \frac{1}{2} \mu_p C_{OX} \frac{W}{L} (V_{SG} - |V_T|)^2 (1 + \lambda V_{SD}) \qquad \text{Equation 5}$$

Because source-drain current is proportional to the square of source-gate voltage, the scalar relating $I_{OUT}$ to $I_{SENSE}$ can be relatively small (or very small). This enables $I_{SENSE}$—and accordingly, power consumed by the clamp circuit 162—to be relatively small until $V_{Pdrive}$ reaches $V_{TRIODE}$. As $V_{Pshift}$ decreases, decreasing $V_{Pdrive}$ past $V_{TRIODE}$, the $$I_{SD} \propto V_{SG}^2$$

relationship between $I_{SENSE}$ and the $V_{SG}$ of MPsense 152 (and MPout 136) causes the voltage $V_{DD}-I_{SENSE} \times R4$ to reach the threshold voltage of MPclamp 160 with relatively small further changes in $V_{Pdrive}$. This quadratic relationship also reduces a voltage range in which MPclamp 160 is nearly turned on or barely turned on, giving the MPclamp 160 a more sharply defined activation and, accordingly, improving tolerance of the clamp circuit 162 to manufacturing variability.

After MPclamp 160 activates, $I_{CLAMP}$ increases proportionally to $V_{SG}^4$ to increase the voltage drop across the resistance of the second current source 128. $I_{CLAMP}$ increases proportionally to $V_{SG}^4$ because MPsense 152 is caused to remain in the saturation region by MP16N 154, as described above, and MPclamp 160 activates in the saturation region. (Recall that p-channel MOSFETs activate when the bias voltage is under a threshold, while n-channel MOSFETs activate when the bias voltage is over a threshold.) As shown in and described with respect to Equation 5, below, source-drain current is proportional to the square of source-gate voltage in a p-channel MOSFET operating in the saturation region.

$$I_{SENSE} \propto V_{SG}^2, \text{ and } I_{CLAMP} \propto (I_{SENSE} \times R4)^2,$$

so that $I_{CLAMP} \propto V_{SG}^4$. The fourth-power relationship causes $I_{CLAMP}$ to rapidly increase once MPclamp 160 is turned on.

After MPclamp 160 activates, the $$I_{SD} \propto V_{SG}^4$$

relationship between $I_{CLAMP}$ and the $V_{SG}$ of MPsense 152 (and MPout 136) enables $I_{CLAMP}$ to scale quickly to clamp $V_{Psense}$ and $V_{Pdrive}$. Accordingly, $I_{CLAMP}$ clamps $V_{Pshift}$ so that $V_{Pdrive}$ will not drop to (or approach) a level such that $V_{SG} \geq V_{EVL}$. This process is further described with respect to FIGS. 2 and 3. In some examples, $I_{CLAMP}$ can be up to a current of the second current source 128.

Runaway feedback loop behavior leading to output transistor gate oxide tunneling can also be considered in light of current analysis of the amplifier stage 129. While $V_{OUT} \leq V_{DD}$, the current through M3N 110 is approximately equal to the current through M5N 116 (the current in each "arm" of the amplifier stage 129 is approximately equal). In some examples, while $V_{OUT} \leq V_{DD}$, the current through the first current source 104 equals $I_B$, the currents through M1P 106, M2P 108, M8P 122, and M9P 124 equal $I_B/2$, and the currents through M3N 110 and M5N 116 equal $I_B$. As $V_{IN}$ increases past ideal $V_{OUT} > V_{DD}$, proper function of the second current source 128 is compromised (for example, transistors within the second current source 128 may no longer be properly biased), so that currents through M1P 106, M3N 110, M8P 122, and M9P 124 approach zero, while current through M2P 108 approaches $I_B$ and current through M5N 116 remains $I_B$. This leads to overstress on MPout 136, with $V_{SG}$ increasing to $V_{EVL}$. Introduction of the clamping current $I_{CLAMP}$ maintains proper function of the second current source 128 (such as proper biasing of second current source 128 transistors), so that currents remain balanced between arms of the amplifier stage 129 though currents are unbalanced between M1P 106 and M2P 108, and overstress on MPout 136 is prevented.

Figure 2:
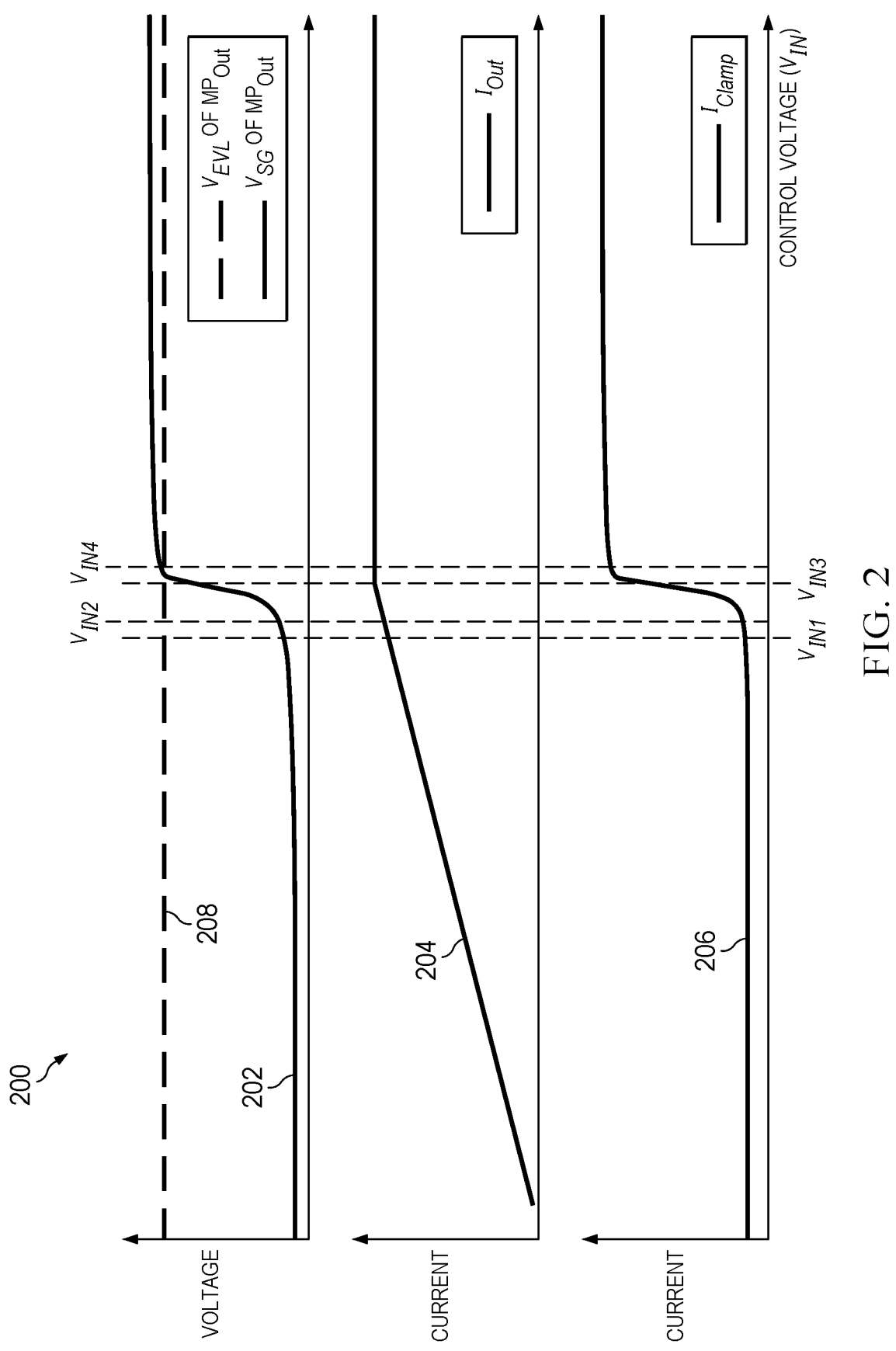
FIG. 2 shows a graph of example open loop behavior of various signals as input voltage is varied in the amplifier of FIG. 1.

FIG. 2 shows a graph 200 of example open loop behavior of various signals as control voltage $V_{IN}$ is varied in the amplifier 100 of FIG. 1. Accordingly, signals represented in the graph 200 behave as if the drain of MPclamp 160 were connected to ground 114, so that $I_{CLAMP}$ 206 is generated responsive to $V_{Pdrive}$ and an operating region of MPout 136, but does not prevent $V_{SG}$ of MPout 136 from increasing to $V_{EVL}$ 208. The horizontal axis corresponds to the control voltage $V_{IN}$. For a $V_{SG}$ of MPout 136 curve 202, the vertical axis is voltage. For an output current $I_{OUT}$ curve 204 (showing current through the output terminal 135) and a clamping current $I_{CLAMP}$ curve 206, the vertical axis is current. A horizontal dotted line shows $V_{EVL}$ 208.

At values of $V_{IN} < V_{IN1}$, $V_{SG}$ changes relatively little as $V_{IN}$ increases. This is because MPout 136 is in the saturation region, so that $I_{OUT}$ 204 is proportional to $V_{SG}^2$, which means the amplifier stage 129 can control MPshift 148, according to the feedback loop mediated by $V_{FB}$, so that relatively small changes in $V_{SG}$ 202 cause relatively large changes in $I_{OUT}$ 204 and $V_{OUT}$. As described above, $V_{OUT}$ is related to $I_{OUT}$ 204, R1, R2, and R3. At a first control voltage level $V_{IN1}$, $V_{SG}$ 202 causes MPout 136 to enter the triode region. At a second voltage level $V_{IN2}$, MPclamp 160 activates (turns on) to conduct, so that $I_{CLAMP}$ 206 is conducted by the source-drain path of MPclamp 160. At values of $V_{IN}>V_{IN1}$, MPout 136 is in the triode region, and $V_{SG}$ 202 increases relatively rapidly. At values of $V_{IN}>V_{IN2}$, $I_{CLAMP}$ 204 increases relatively rapidly, proportional to $V_{SG}^{4}$. In some examples, MOSFETs conform relatively well to Equations 4 and 5 while well within a respective operating region, but conform relatively poorly to behavior described by Equations 4 and 5 near transitions between operating regions. At a third control voltage level $V_{IN3}$, MPout 136 is fully conductive, and at higher control voltages ($V_{IN}$) $I_{OUT}$ 204 does not change further. A relatively small further increase in the control voltage level, from $V_{IN3}$ to $V_{IN4}$, results in the feedback loop of the amplifier 100 pushing $V_{SG}$ 202 to $V_{EVL}$ ($I_{CLAMP}$ does not prevent this because the graph 200 shows open loop behavior).

Figure 3:
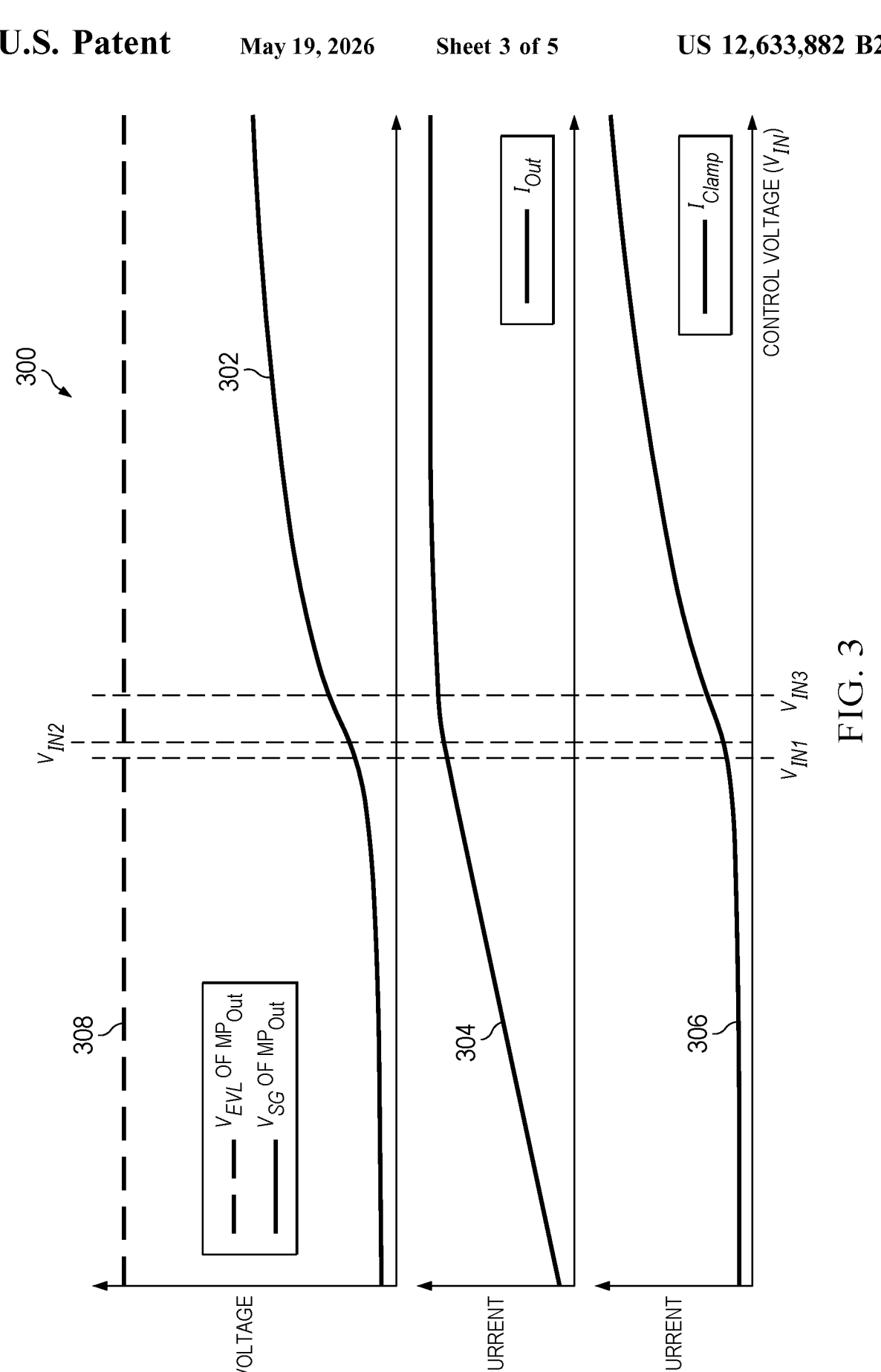
FIG. 3 shows a graph of example closed loop behavior of various signals as input voltage is varied in the amplifier of FIG. 1.

FIG. 3 shows a graph 300 of example closed loop behavior of various signals as input voltage is varied in the amplifier of FIG. 1. The horizontal axis corresponds to the control voltage $V_{IN}$. For a $V_{SG}$ of MPout 136 curve 302, the vertical axis is voltage. For an output current $I_{OUT}$ curve 304 (showing current through the output terminal 135) and a clamping current $I_{CLAMP}$ curve 306, the vertical axis is current. At values of $V_{IN}<V_{IN1}$, $V_{SG}$ changes relatively little as $V_{IN}$ increases. This is because MPout 136 is in the saturation region. At a first control voltage level $V_{IN1}$, $V_{SG}$ causes MPout 136 to enter the triode region. At a second voltage level $V_{IN2}$, MPclamp 160 activates (turns on) to conduct, so that $I_{CLAMP}$ 306 is conducted through the source-drain path of MPclamp 160. $I_{CLAMP}$ 306 prevents the rapid increase in $V_{SG}$ 202 shown in the open loop behavior graph 200 of FIG. 2. At a third control voltage level $V_{IN3}$, $I_{OUT}$ 304 (and accordingly, $V_{OUT}$) reaches a maximum level. However, even after $V_{IN}>V_{IN3}$, $I_{CLAMP}$ 306 enables the amplifier 100 to avoid a runaway feedback loop, clamping $V_{Pshift}$, and accordingly preventing MPshift 148 from increasing $V_{Pdrive}$ to the point that $V_{SG}$ 302 reaches $V_{EVL}$ 308.

Figure 4:
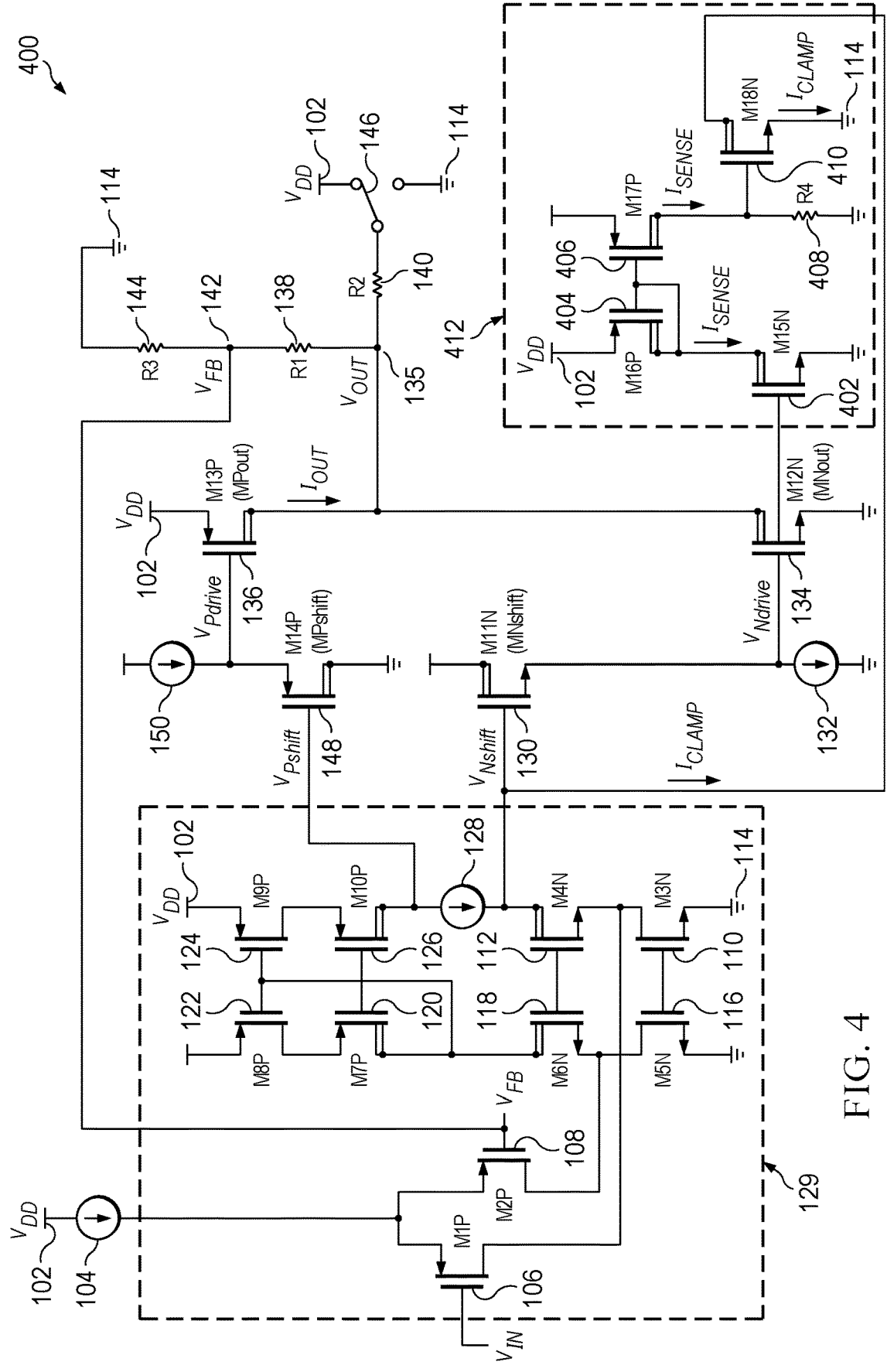
FIG. 4 shows a circuit diagram of an example amplifier.

FIG. 4 shows a circuit diagram of an example amplifier 400. Components in the amplifiers 400 and 500 of FIGS. 4 and 5 (respectively) that are similar and similarly located to components in the amplifier 100 of FIG. 1 are given the same item numbers. The amplifier 400 does not include the clamp circuit 162. Instead, a gate of a fifteenth n-channel MOSFET M15N 402 is connected to the source of MNshift 130, the input terminal of the third current source 132, and the gate of MNout 134, so that the gate of M15N 402 is biased by $V_{Ndrive}$. A source of M15N 402 is connected to ground 114. M15N 402 is referred to as MNsense 402, because it is used to generate a current $I_{SENSE}$ used to sense the region in which MNout 134 is operating—accordingly, whether MNout 134 is operating in the saturation region or the triode region. A drain of M15N 402 is connected to a drain and a gate of a sixteenth p-channel MOSFET M16P 404, and to a gate of a seventeenth p-channel MOSFET M17P 406. A source of M16P 404 and a source of M17P 406 are connected to the high voltage reference 102. A drain of M17P is connected to a first terminal of a fourth resistor R4 and to a gate of an eighteenth n-channel MOSFET M18N 410. M18N 410 is referred to as MNclamp 410, because it is used to generate $I_{CLAMP}$. Together, MNsense 402, M16P 404, M17P 406, R4 408, and MNclamp 410 are referred to as a clamp circuit 412. The clamp circuit 412 functions similarly to the clamp circuit 162 of the amplifier of FIG. 1.

Figure 5:
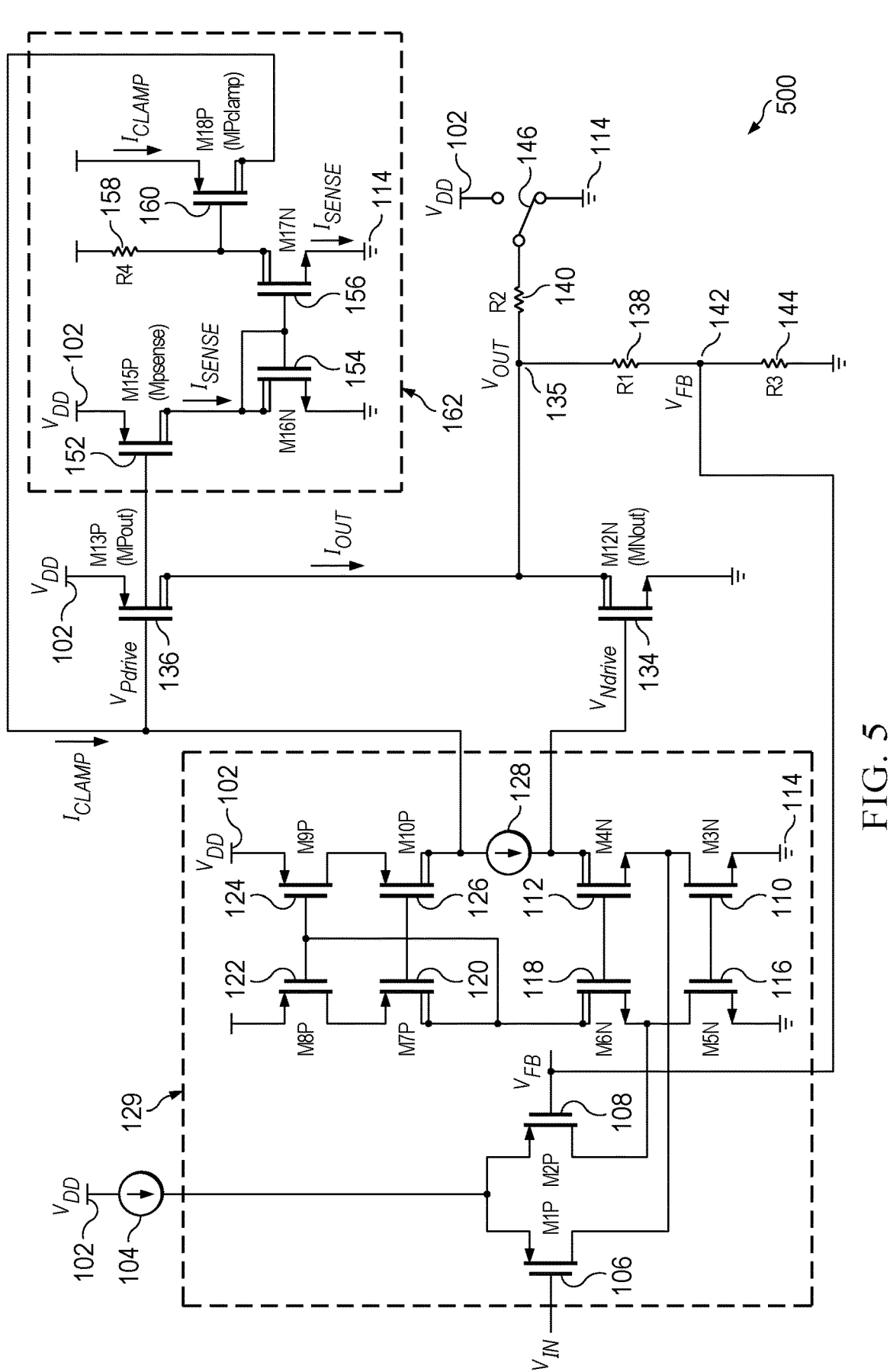
FIG. 5 shows a circuit diagram of an additional example amplifier.

FIG. 5 shows a circuit diagram of an example amplifier 500. The amplifier 500 uses the same components, with the same numbering, as the amplifier 100 of FIG. 1, except as follows. MNshift 130, MPshift 148, and the third and fourth current sources 132 and 150 are removed. The gate of MPout 136 is coupled to the drain of M10P 126, the input terminal of the second current source 128, the gate of MPsense 152, and the drain of MPclamp 160. The gate of MNout 134 is coupled to the source of M4N 112 and the output terminal of the second current source 128. Accordingly, $I_{CLAMP}$ increases $V_{Pdrive}$ by adding an additional voltage drop across the second current source 128, preventing $V_{DD}$ minus $V_{Pdrive}$—which equals $V_{SG}$—from exceeding $V_{EVL}$.

Modifications are possible in the described embodiments, and other embodiments are possible, within the scope of the claims.

In some examples, $I_{CLAMP}$ is proportional to, but is not the same as, $I_{SENSE}$. In some examples, $I_{CLAMP}$ is responsive to, but is not the same as, $I_{SENSE}$.

In some examples, the clamp circuit 162 or 412 activates at a voltage near to and greater than to $V_{TRIODE}$, so that the clamp circuit 162 or 412 activates before the $V_{SG}$ of MPout 136 or the $V_{GS}$ of MNout 134 (respectively) exceeds $V_{EVL}$, and outputs sufficient $I_{CLAMP}$ to prevent the $V_{SG}$ of MPout 136 or the $V_{GS}$ of MNout 134 from exceeding $V_{EVL}$.

In some examples, resistive elements (real impedances) are used other than resistors.

In some examples, a source-drain path, or drain-source path, of a transistor is referred to as a conductive path of the transistor.

In some examples, transistors other than MOSFETs are used.

Examples described above are described with respect to particular topologies and particular types of MOSFET devices. In some examples, different topologies are used. In some examples, n-channel type MOSFETS are used instead of some p-channel type MOSFETS. In some examples, p-channel type MOSFETS are used instead of some n-channel type MOSFETS.

In some examples, the excessive voltage limit is also referred to as a gate oxide tunneling voltage.

In some examples, MPout 136 enters the triode region when $V_{SG}>V_T$ and $V_{SG}-V_T>V_{SD}$, so that $V_{Pdrive}\leq V_{OUT}-V_T$.

In some examples, an amplifier such as the amplifier 100 of FIG. 1 or the amplifier 400 of FIG. 4 includes both the clamp circuit 162 of FIG. 1 and the clamp circuit 412 of FIG. 4.

In some examples, as used herein (including, but not limited to, with respect to the claims), gate-source voltage refers to gate-source voltage for n-channel type MOSFETs and source-gate voltage for p-channel type MOSFETs, as appropriate. Also, drain-source voltage refers to drain-source voltage for n-channel type MOSFETs and source-drain voltage for p-channel type MOSFETs, as appropriate. In some examples, as used herein (including, but not limited to, with respect to the claims), source-gate voltage refers to gate-source voltage for n-channel type MOSFETs and source-gate voltage for p-channel type MOSFETs, as appropriate. Also, source-drain voltage refers to drain-source voltage for n-channel type MOSFETs and source-drain voltage for p-channel type MOSFETs, as appropriate.

In some examples, the high voltage reference 102 is referred to as a high reference voltage terminal 102. In some examples, the ground 114, or low voltage reference 114, is referred to as a low reference voltage terminal 114.

In some examples, MNout 134 and MPout 136 are referred to as output transistors. In some examples, an output transistor is a transistor, such as a MOSFET, that controls $V_{OUT}$ by connecting the output terminal 135 to, or disconnecting the output terminal 135 from, the high voltage reference 102 or the low voltage reference 114, depending on an activation state of the output transistor.

In some examples, such as the amplifier 100 of FIG. 1, MPshift 148 is referred to as a driving circuit of MPout 136, $V_{Pshift}$ is referred to as a driving input, and $V_{Pdrive}$ is referred to as a driving output. In some examples, such as the amplifier 400 of FIG. 4, MNshift is referred to as a driving circuit of MNout 134, $V_{Nshift}$ is referred to as a driving input, and $V_{Ndrive}$ is referred to as a driving output. In some examples, such as the amplifier 500 of FIG. 5, the amplifier stage 129 is referred to as a driving circuit of MPout 136, $V_{IN}$ is referred to as a driving input, and $V_{Pdrive}$ is referred to as a driving output. Accordingly, in some examples, a circuit that provides a voltage to drive an output transistor is referred to as a driving circuit, the voltage provided by the driving circuit to drive the output transistor is referred to as a driving output, and an input of the driving circuit that controls the driving circuit to provide the driving output is referred to as a driving input.

In some examples, a node providing a voltage that a resistor divider divides is referred to as a resistor divider input. In some examples, a node providing a voltage corresponding to the voltage at the resistor divider input, divided by the resistor divider, is referred to as a resistor divider output.

What is claimed is:

1. A circuit, comprising:
a reference voltage terminal adapted to receive a reference voltage;
a driving circuit including a driving input and a driving output;
an output transistor including a source, a drain, and a gate, the source coupled to the reference voltage terminal; and
a clamp circuit including a clamp input and a clamp output, the clamp input coupled to the driving output and to the gate, the clamp output coupled to either the driving input or to the driving output, the gate, and the clamp input, the clamp circuit configured to detect an operating region of the output transistor and to generate a clamping current after the output transistor enters a triode region, the clamping current selected to prevent an absolute value of a source-gate voltage of the output transistor from being greater than or equal to a gate oxide tunneling voltage of the output transistor.

2. The circuit of claim 1, further including:
an output terminal having an output voltage, the output terminal coupled to the drain; and
a control input terminal adapted to receive a control voltage, the driving circuit configured to control the output voltage by generating the bias voltage of the output transistor in response to the control voltage and the output voltage;
wherein the output voltage is limited responsive to the reference voltage.

3. The circuit of claim 2, further including an amplifier, the amplifier including an amplifier input and an amplifier output and having a gain, the amplifier input coupled to receive a voltage responsive to the control voltage, the amplifier output coupled to the driving input and the clamp circuit output.

4. The circuit of claim 3,
further including a resistor divider, the resistor divider including a resistor divider input and a resistor divider output, the resistor divider input coupled to the output terminal, the resistor divider output coupled to a feedback node having a feedback voltage;
wherein the amplifier input is a first amplifier input, the amplifier including a second amplifier input coupled to receive a voltage responsive to the feedback voltage, the amplifier configured to generate an amplified voltage responsive to a difference between a voltage at the first amplifier input and a voltage at the second amplifier input.

5. The circuit of claim 3,
the amplifier including a first amplifier transistor and a second amplifier transistor;
wherein the amplifier is configured, and the clamping current is selected, so that a current through a conductive path of the first amplifier transistor and a current through a conductive path of the second amplifier transistor are balanced with each other responsive to the clamping current.

6. The circuit of claim 1,
wherein the source is a first source, the gate is a first gate, and the drain is a first drain;
wherein the clamp circuit includes a matching transistor, the matching transistor including a second source, a second gate, and a second drain, a current through a source-drain path of the matching transistor configured to be proportional to a current through a source-drain path of the output transistor if the matching transistor and the output transistor are in the same operating region; and
wherein the second source is coupled to the reference voltage terminal, and the second gate is coupled to the clamp input.

7. The circuit of claim 1,
wherein the source is a first source, the gate is a first gate, and the drain is a first drain;
wherein the clamp circuit includes a first clamping transistor, a second clamping transistor, and a current mirror including a first side and a second side;
wherein the first clamping transistor includes a second source, a second gate, and a second drain, the second source coupled to the reference voltage, the second gate coupled to the clamp circuit input, and the second drain coupled to a current path of the first side; and
wherein the second clamping transistor includes a third source, a third gate, and a third drain, the third source coupled to the reference voltage, the third gate coupled to a current path of the second side, and the third drain coupled to the clamp circuit output.

8. The circuit of claim 7, wherein a threshold voltage of the second clamping transistor is selected so that the second clamping transistor is activated in response a level of a current through the second side that corresponds to a voltage at the first gate causing the output transistor to be in the triode region.

9. The circuit of claim 8, wherein a level of a current through the second clamping transistor, after the second clamping transistor is activated, is selected to prevent an absolute value of a source-gate voltage of the output transistor from being greater than or equal to a gate oxide tunneling voltage of the output transistor.

10. The circuit of claim 7, wherein the first side is configured to prevent the first clamping transistor from entering the triode region.

11. A circuit, comprising:

a reference voltage terminal adapted to receive a reference voltage;

a driving circuit including a driving input and a driving output;

an output transistor including a first source, a first drain, and a first gate, the source coupled to the reference voltage terminal; and a clamp circuit including a first clamping transistor, a second clamping transistor, a current mirror including a first side and a second side, and a resistive element including a first resistor terminal and a second resistor terminal;

wherein the first clamping transistor includes a second source, a second gate, and a second drain, the second source coupled to the reference voltage, the second gate coupled to the driving output and the first gate, and the second drain coupled to a current path of the first side, a bias response of the first clamping transistor configured to match a bias response of the output transistor;

wherein the first resistor terminal is coupled to the reference voltage; and wherein the second clamping transistor includes a third source, a third gate, and a third drain, the third source coupled to the reference voltage, the third gate coupled to the second resistor terminal and to a current path of the second side, and the third drain coupled either to the driving input or to the first gate and the driving output.

12. The circuit of claim 11, wherein a threshold voltage of the second clamping transistor is selected so that the second clamping transistor is activated in response a level of a current through the second side that corresponds to a voltage at the first gate causing the output transistor to be in a triode region.

13. The circuit of claim 12, wherein a level of a current through the second clamping transistor, after the second clamping transistor is activated, is selected to prevent an absolute value of a source-gate voltage of the output transistor from being greater than or equal to a gate oxide tunneling voltage of the output transistor.

14. The circuit of claim 11, wherein the first side is configured to prevent the first clamping transistor from entering a triode region.

15. The circuit of claim 11, further including:

an output terminal having an output voltage, the output terminal coupled to the first drain; and a control input terminal adapted to receive a control voltage, the driving circuit configured to control the output voltage by generating a bias voltage of the output transistor in response to the control voltage and the output voltage;

wherein the output voltage is limited responsive to the reference voltage.

16. The circuit of claim 15, further including an amplifier, the amplifier including an amplifier input and an amplifier output and having a gain, the amplifier input coupled to receive a voltage responsive to the control voltage, the amplifier output coupled to the driving input and the third drain.

17. The circuit of claim 16, the amplifier including a first amplifier transistor and a second amplifier transistor;

wherein the first clamping transistor is configured to generate a sensing current in response to a bias voltage of the output transistor;

wherein the second clamping transistor is configured to generate a clamping current in response to a level of the sensing current corresponding to a triode region of the output transistor; and wherein the amplifier is configured, and the clamping current is selected, so that a current through a conductive path of the first amplifier transistor and a current through a conductive path of the second amplifier transistor are balanced with each other responsive to the clamping current.

18. A circuit, comprising:

a reference voltage terminal adapted to receive a reference voltage;

a control input terminal adapted to receive a control voltage;

a driving circuit including a driving input and a driving output;

an output transistor including a first source, a first drain, and a first gate, the source coupled to the reference voltage terminal;

a clamp circuit including a first clamping transistor, a second clamping transistor, a current mirror including a first side and a second side, and a resistive element including a first resistor terminal and a second resistor terminal; and an amplifier including an amplifier input and an amplifier output and having a gain, the amplifier input coupled to receive a voltage responsive to the control voltage;

wherein the first clamping transistor includes a second source, a second gate, and a second drain, the second source coupled to the reference voltage, the second gate coupled to the driving output and the first gate, and the second drain coupled to a current path of the first side, a bias response of the first clamping transistor configured to match a bias response of the output transistor;

wherein the first resistor terminal is coupled to the reference voltage; and wherein the second clamping transistor includes a third source, a third gate, and a third drain, the third source coupled to the reference voltage, the third gate coupled to the second resistor terminal and to a current path of the second side, and the third drain coupled either to the driving input and the amplifier output or to the first gate and the driving output.

19. The circuit of claim 18, wherein a threshold voltage of the second clamping transistor is selected so that the second clamping transistor is activated in response a level of a current through the second side that corresponds to a voltage at the first gate causing the output transistor to be in a triode region.

20. The circuit of claim 19, wherein a level of a current through the second clamping transistor, after the second clamping transistor is activated, is selected to prevent an absolute value of a source-gate voltage of the output transistor from being greater than or equal to a gate oxide tunneling voltage of the output transistor.

* * * * *